(12) United States Patent
Yen et al.

(10) Patent No.: US 10,985,168 B2
(45) Date of Patent: Apr. 20, 2021

(54) SEMICONDUCTOR MEMORY DEVICE

(71) Applicant: United Semiconductor (Xiamen) Co., Ltd., Fujian (CN)

(72) Inventors: Jung-Chun Yen, Taichung (TW); Chien-Chih Wang, Tainan (TW); Guang Yang, Fujian (CN); Jiawei Lyu, Quanzhou (CN); Linshan Yuan, Fujian (CN); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 0 days.

(21) Appl. No.: 16/589,150

(22) Filed: Oct. 1, 2019

(65) Prior Publication Data

US 2021/0066322 A1 Mar. 4, 2021

(30) Foreign Application Priority Data

Sep. 2, 2019 (CN) .......................... 201910822091.X

(51) Int. Cl.
*H01L 27/11521* (2017.01)
*H01L 23/00* (2006.01)
*H01L 31/09* (2006.01)

(52) U.S. Cl.
CPC ........ *H01L 27/11521* (2013.01); *H01L 24/83* (2013.01); *H01L 31/09* (2013.01)

(58) Field of Classification Search
CPC ..... H01L 27/11521; H01L 24/83; H01L 31/09
See application file for complete search history.

(56) References Cited

U.S. PATENT DOCUMENTS

| | | | | |
|---|---|---|---|---|
| 6,765,254 B1* | 7/2004 | Hui | ....................... | H01L 23/552 257/296 |
| 6,833,581 B1* | 12/2004 | Hui | ....................... | H01L 23/556 257/296 |
| 6,894,342 B1* | 5/2005 | Hui | ................... | H01L 23/53295 257/317 |
| 6,974,989 B1* | 12/2005 | Chen | ..................... | H01L 27/115 257/296 |
| 6,989,563 B1* | 1/2006 | Achuthan | ......... | H01L 23/53295 257/315 |
| 7,091,088 B1* | 8/2006 | Cheng | ............... | H01L 21/76829 257/E21.679 |
| 7,927,723 B1* | 4/2011 | Hui | ....................... | G02B 5/208 428/701 |
| 8,022,468 B1* | 9/2011 | Ngo | ...................... | H01L 23/552 257/325 |

(Continued)

*Primary Examiner* — Karen Kusumakar
*Assistant Examiner* — Adam S Bowen
(74) *Attorney, Agent, or Firm* — Winston Hsu

(57) ABSTRACT

A semiconductor memory device includes a substrate, at least one floating gate electrode, an interlayer dielectric layer, an interconnection structure, an etching stop layer, a conductive structure, and an opening. The floating gate electrode is disposed on the substrate. The interlayer dielectric layer is disposed on the floating gate electrode. The interconnection structure is disposed in the interlayer dielectric layer. The etching stop layer is disposed on the interlayer dielectric layer. The conductive structure penetrates the etching stop layer and is electrically connected with the interconnection structure. The opening penetrates the etching stop layer and overlaps at least a part of the floating gate electrode in a thickness direction of the substrate.

19 Claims, 7 Drawing Sheets

(56) References Cited

U.S. PATENT DOCUMENTS

| | | | | |
|---|---|---|---|---|
| 2004/0151025 A1* | 8/2004 | Ngo | ................. | H01L 29/66833 |
| | | | | 365/185.01 |
| 2007/0257302 A1* | 11/2007 | Kang | .................... | H01L 27/115 |
| | | | | 257/315 |
| 2020/0126987 A1* | 4/2020 | Rubin | ............... | H01L 21/76897 |

\* cited by examiner

SEMICONDUCTOR MEMORY DEVICE

BACKGROUND OF THE INVENTION

1. Field of the Invention

The present invention relates to a semiconductor memory device, and more particularly, to a semiconductor memory device including a floating gate electrode.

2. Description of the Prior Art

Semiconductor memory devices are used in computer and electronics industries as a means for retaining digital information or data. Typically, the semiconductor memory devices are divided into volatile and non-volatile memory devices. The non-volatile memory devices, which can retain their data even when the power supply is interrupted, have been widely employed. Generally, the non-volatile memory devices may be roughly divided into multiple-time programmable (MTP) non-volatile memory devices and one-time programmable (OTP) non-volatile memory devices. The OTP non-volatile memory devices are generally used in applications which do not have to constantly change programming contents and require longer data retention. In the design of some of the OTP non-volatile memory devices, the OTP non-volatile memory device may be programed by voltage higher than commonly used voltage in electronic circuits, and an erasing operation may only be done by ultraviolet (UV) irradiation after the OTP non-volatile memory device is programed. However, the structural design and/or the packaging design of the OTP non-volatile memory device are limited by the UV irradiation requirement, and the related applications of the OTP non-volatile memory device are influenced accordingly.

SUMMARY OF THE INVENTION

It is one of the objectives of the present invention to provide a semiconductor memory device. An opening is disposed in an etching stop layer and disposed corresponding to a floating gate electrode for avoiding influence of the etching stop layer on an irradiation operation performed to the floating gate electrode. Therefore, the etching stop layer may be employed to provide required process effect in a manufacturing method of the semiconductor memory device without influencing operating conditions of the semiconductor memory device.

A semiconductor memory device is provided in an embodiment of the present invention. The semiconductor memory device includes a substrate, at least one floating gate electrode, an interlayer dielectric layer, an interconnection structure, an etching stop layer, a conductive structure, and an opening. The floating gate electrode is disposed on the substrate. The interlayer dielectric layer is disposed on the floating gate electrode. The interconnection structure is disposed in the interlayer dielectric layer. The etching stop layer is disposed on the interlayer dielectric layer. The conductive structure penetrates the etching stop layer and is electrically connected with the interconnection structure. The opening penetrates the etching stop layer and overlaps at least a part of the floating gate electrode in a thickness direction of the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 and FIG. 3 are schematic drawings illustrating a manufacturing method of a semiconductor memory device according to a second embodiment of the present invention, wherein FIG. 3 is a schematic drawing in a step subsequent to FIG. 2.

FIGS. 5-7 are schematic drawings illustrating a manufacturing method of a semiconductor memory device according to a third embodiment of the present invention, wherein FIG. 6 is a schematic drawing in a step subsequent to FIG. 5, and FIG. 7 is a schematic drawing in a step subsequent to FIG. 6.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
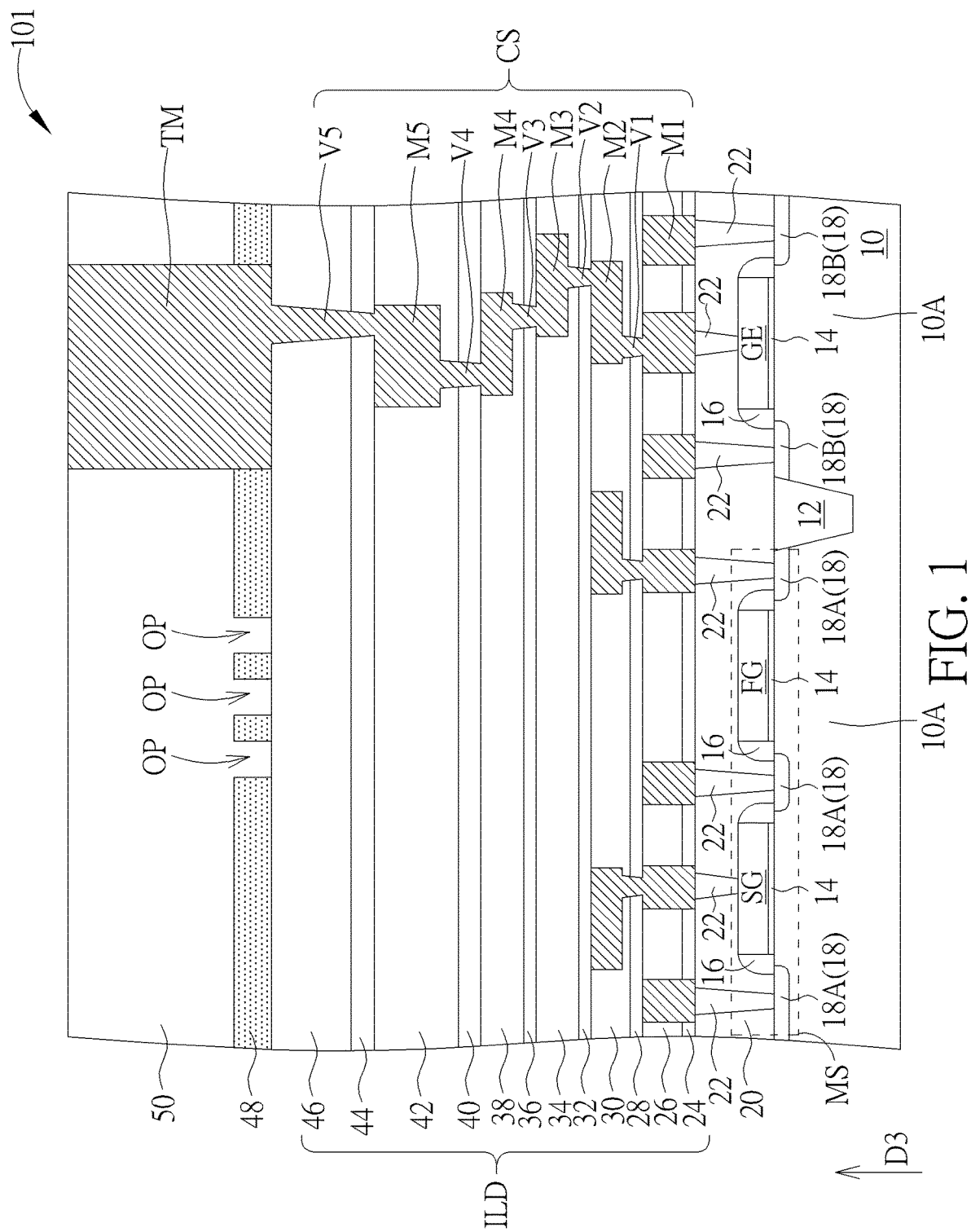
FIG. 1 is a schematic drawing illustrating a semiconductor memory device according to a first embodiment of the present invention.

Please refer to FIG. 1. FIG. 1 is a schematic drawing illustrating a semiconductor memory device according to a first embodiment of the present invention. As shown in FIG. 1, a semiconductor memory device 101 is provided in this embodiment. The semiconductor memory device 101 includes a substrate 10, at least one floating gate electrode FG an interlayer dielectric layer ILD, an interconnection structure CS, an etching stop layer 48, a conductive structure TM, and an opening OP. The floating gate electrode FG is disposed on the substrate 10. The interlayer dielectric layer ILD is disposed on the floating gate electrode FG The interconnection structure CS is disposed in the interlayer dielectric layer ILD. The etching stop layer 48 is disposed on the interlayer dielectric layer ILD. The conductive structure TM penetrates the etching stop layer 48 and is electrically connected with the interconnection structure CS. The opening OP penetrates the etching stop layer 48 and the opening OP overlaps at least a part of the floating gate electrode FG in a thickness direction of the substrate 10 (such as a third direction D3 shown in FIG. 1). By disposing the opening OP in the etching stop layer 48 and disposing the opening OP corresponding to the floating gate electrode FG the influence of the etching stop layer 48 on an irradiation operation performed to the floating gate electrode FG may be avoided. For example, when the etching stop layer 48 is capable of absorbing some light (such as ultraviolet light, but not limited thereto) because of the material properties and the floating gate electrode FG has to be irradiated by a specific light (such as ultraviolet light, but not limited thereto) for some operation purposes (such as an erasing operation, but not limited thereto), at least a portion of the irradiation operation required to be performed to the floating gate electrode FG may be blocked by the etching stop layer 48, and the manufacturing process and/or the product functions of the semiconductor memory device 101 may be influenced accordingly. Therefore, the irradiation operation required to be performed to the floating gate electrode FG may be executed successfully by disposing the opening OP in the etching stop layer 48 and disposing the opening corresponding to the floating gate electrode FG; and the etching stop layer 48 capable of absorbing the light used in the irradiation operation may also be used to shield parts in the semiconductor memory device 101 that do not want to be irradiated in the irradiation operation for avoiding the influence of the electrical performance of the semiconductor memory device 101.

In some embodiments, the light used in the irradiation operation described above may include ultraviolet (UV) radiation, and the etching stop layer 48 may be capable of absorbing at least a part of UV radiation, but not limited thereto. In some embodiments, light within other wavelength ranges may be used in the irradiation operation performed to the floating gate electrode FG according to some considerations, and the etching stop layer 48 may be capable of absorbing at least a part of this light. Specifically, in some embodiments, an ultraviolet absorptance (may also be regarded as extinction coefficient, k) of the etching stop layer 48 may be higher than or equal to 50%, but not limited thereto. Additionally, a material composition of the etching stop layer 48 may be different from a material composition of the interlayer dielectric layer ILD, and the ultraviolet absorptance of the etching stop layer 48 may be higher than an ultraviolet absorptance of the interlayer dielectric layer ILD. For example, in some embodiments, the material of the etching stop layer 48 may include silicon oxynitride or other suitable insulation materials having required etching stop characteristic, and the interlayer dielectric layer ILD may include multiple layers of dielectric materials stacked in the third direction D3. The dielectric material mentioned above may include silicon oxide, silicon nitride, silicon carbonitride, fluorosilicate glass (FSG), low dielectric constant (low-k) material or other suitable dielectric materials. The low-k material mentioned above may include a dielectric material with relatively lower dielectric constant (such as dielectric constant lower than 2.9, but not limited thereto), such as benzocyclobutene (BCB), hydrogen silsesquioxane (HSQ), methyl silsesquioxane (MSQ), hydrogenated silicon oxycarbide (SiOC—H), and/or porous dielectric materials.

In some embodiments, the substrate 10 may include a silicon substrate, a silicon germanium semiconductor substrate, a silicon-on-insulator (SOI) substrate, or a substrate made of other suitable materials. Additionally, in some embodiments, the semiconductor memory device 101 may further include an isolation structure 12, a gate dielectric layer 14, a selecting gate electrode SG and a gate electrode GE. The isolation structure 12 may be disposed in the substrate 10 for defining active regions 10A separated from one another in the substrate 10. The isolation structure 12 may include a single layer or multiple layers of insulation materials, such as silicon oxide, silicon nitride, or other suitable insulation materials. The selecting gate electrode SG and the gate electrode GE may be disposed on the substrate 10, and the gate dielectric layer 14 may be at least partially disposed between the gate electrode GE and the substrate 10. In some embodiments, the gate dielectric layer 14 may also be disposed between the floating gate electrode FG and the substrate 10 and/or be disposed between the selecting gate electrode SG and the substrate 10 according to some considerations. The gate dielectric layer 14 disposed between the floating gate electrode FG and the substrate 10, the gate dielectric layer 14 disposed between the selecting gate electrode SG and the substrate 10, and the gate dielectric layer 14 disposed between the gate electrode GE and the substrate 10 may have the same material composition or have different material compositions according to some considerations. In some embodiments, the gate dielectric layer 14 may include an oxide layer, such as a silicon oxide layer or other suitable dielectric materials. Additionally, in some embodiments, the floating gate electrode FG the selecting gate electrode SG and the gate electrode GE may be formed of the same material and formed concurrently by the same process, but not limited thereto. For example, the floating gate electrode FG the selecting gate electrode SG and the gate electrode GE may respectively include polysilicon (such as doped polysilicon) or other suitable conductive materials. In some embodiments, the floating gate electrode FG the selecting gate electrode SG and the gate electrode GE may also be formed of different materials and/or be formed by different processes according to some considerations.

In some embodiments, a spacer 16 may be formed on a sidewall of the floating gate electrode FG a sidewall of the selecting gate electrode SG and a sidewall of the gate electrode GE, and the spacer 16 may be used in a suitable doping process for forming a plurality of doped regions 18 in the substrate 10, but not limited thereto. The spacer 16 may include a single layer or multiple layers of insulation materials, such as silicon oxide, silicon nitride, or other suitable insulation materials. The doped regions 18 located at different positions may have different doped conditions (such as N-type doped regions or P-type doped regions) according to some considerations. For example, the doped regions 18 may include a plurality of first doped regions 18A and a plurality of second doped regions 18B. The first doped regions 18A may be located at two opposite sides of the floating gate electrode FG and two opposite sides of the selecting gate electrode SG and the second doped regions 18B may be located at two opposite sides of the gate electrode GE. The dopant type of the first doped region 18A may be the same as or complementary to that of the second doped region 18B. In some embodiments, a memory unit MS may be formed of the floating gate electrode FG the selecting gate electrode SG a portion of the gate dielectric layer 14, the first doped regions 18A and the corresponding active regions 10A, and another semiconductor unit (such as a transistor in a logic device) may be formed of the gate electrode GE, another portion of the gate dielectric layer 14, the second doped regions 18B and the corresponding active region 10A, but not limited thereto. In some embodiments, the memory unit MS may include a non-volatile memory unit or other suitable types of memory units, and the non-volatile memory unit mentioned above may include a one-time programmable (OTP) non-volatile memory unit or other suitable types of non-volatile memory units. In other words, in some embodiments, the floating gate electrode FG and the selecting gate electrode SG may be a part of a non-volatile memory unit, and the non-volatile memory unit may include an OTP non-volatile memory unit, but not limited thereto.

In some embodiments, the semiconductor memory device 101 may further include an insulation layer 20 and a plurality of contact structures 22. The insulation layer 20 may be located between the substrate 10 and the interlayer dielectric layer ILD and cover the floating gate electrode FG the selecting gate electrode SG the gat electrode GE, and the doped regions 18. The contact structures 22 may be located in the insulation layer 20 and be electrically connected with the selecting gate electrode SG the gate electrode GE, and the doped regions 18 respectively. In some embodiments, the insulation layer 20 may include a single layer or multiple layers of insulation materials, such as silicon oxide, silicon nitride, or other suitable insulation materials, and each of the contact structures 22 may include a low resistance material and a barrier layer, but not limited thereto. The low resistance material described above may include materials with relatively lower resistivity, such as copper, aluminum, and tungsten, and the barrier layer described above may include titanium nitride, tantalum nitride, or other suitable barrier materials, but not limited thereto. Each of the contact structures 22 may be used to electrically connect the selecting gate electrode SG with the interconnection structure CS, electrically connect the gate electrode GE with the interconnection structure CS, or electrically connect the doped region 18 with the interconnection structure CS, but not limited thereto.

In some embodiments, the interconnection structure CS may include conductive layers (such as a conductive layer M1, a conductive layer M2, a conductive layer M3, a conductive layer M4, and a conductive layer M5 shown in FIG. 1) and connection plugs (such as a connection plug V1, a connection plug V2, a connection plug V3, a connection plug V4, and a connection plug V5 shown in FIG. 1) alternately disposed in the thickness direction of the substrate 10 (such as the third direction D3), and the interlayer dielectric layer ILD may include a plurality of dielectric layers (such as a dielectric layer 24, a low-k dielectric layer 26, a dielectric layer 28, a low-k dielectric layer 30, a dielectric layer 32, a low-k dielectric layer 34, a dielectric layer 36, a low-k dielectric layer 38, a dielectric layer 40, a dielectric layer 42, a dielectric layer 44, and a dielectric layer 46 shown in FIG. 1) stacked in the third direction D3, but not limited thereto. Each of the conductive layers and each of the connection plugs in the interconnection structure CS may include a low resistance material and a barrier layer. The low resistance material described above may include materials with relatively lower resistivity, such as copper, aluminum, and tungsten, and the barrier layer described above may include titanium nitride, tantalum nitride, or other suitable barrier materials, but not limited thereto.

In some embodiments, the dielectric constants of the low-k dielectric layer 26, the low-k dielectric layer 30, the low-k dielectric layer 34, and the low-k dielectric layer 38 may be lower than the dielectric constants of other dielectric layers in the interlayer dielectric layer ILD for reducing the interference and/or capacitance effect between adjacent conductive lines because the distribution density of the interconnection structure CS located near the bottom part of the interconnection structure CS is relatively higher generally. The low-k dielectric layer 26, the low-k dielectric layer 30, the low-k dielectric layer 34, and the low-k dielectric layer 38 may include low-k dielectric materials, such as BCB, HSQ, MSQ, hydrogenated silicon oxycarbide (SiOC—H), porous dielectric materials, or other suitable low-k materials, and the other dielectric layers in the interlayer dielectric layer ILD may include silicon oxide, silicon nitride, silicon carbonitride, FSG, or other suitable dielectric materials.

In some embodiments, the semiconductor memory device 101 may further include a dielectric layer 50 disposed on the etching stop layer 48 and disposed in the opening OP, and the conductive structure TM may penetrate the dielectric layer 50 and the etching stop layer 48 in the third direction D3 for contacting and being electrically connected with the interconnection structure CS. The dielectric layer 50 may include silicon oxide, silicon nitride, silicon carbonitride, FSG or other suitable dielectric materials, and the conductive structure TM may include a single layer or multiple layers of conductive materials, such as aluminum, silver, chromium, titanium, molybdenum, a compound of the above-mentioned materials, an alloy of the above-mentioned materials, or other suitable conductive materials. It is worth noting that, in some embodiments, the conductive structure TM may be regarded as a top metal structure, and the conductive structure TM needs to have a relatively thick thickness to meet requirements of a bonding process for the semiconductor memory device 101. Therefore, the thickness of the conductive structure TM may be greater than the thickness of each of the conductive layers in the interconnection structure CS (such as the thickness of the conductive layer M1, the thickness of the conductive layer M2, the thickness of the conductive layer M3, the thickness of the conductive layer M4, and the thickness of the conductive layer M5). For instance, the thickness of the conductive structure TM may be greater than 30,000 angstroms, but not limited thereto. Additionally, the thickness of the dielectric layer 50 may be greater than the thickness of the etching stop layer 48, the material composition of the dielectric layer 50 may be different from the material composition of the etching stop layer 48, and the opening OP in the etching stop layer 48 may be fully filled with the dielectric layer 50.

In some embodiments, the semiconductor memory device 101 may include a plurality of the openings OP penetrating the etching stop layer 48 respectively, and each of the openings OP is separated from the conductive structure TM. In some embodiments, the openings OP may be located corresponding to the same floating gate electrode FG or be located corresponding to different floating gate electrodes FG respectively, and each of the openings OP does not overlap the selecting gate electrode SG in the third direction D3 preferably for avoiding negative influence of the above-mentioned irradiation operation performed to the floating gate electrode FG on the selecting gate electrode SG and/or the active region 10A under the selecting gate electrode SG.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 2:
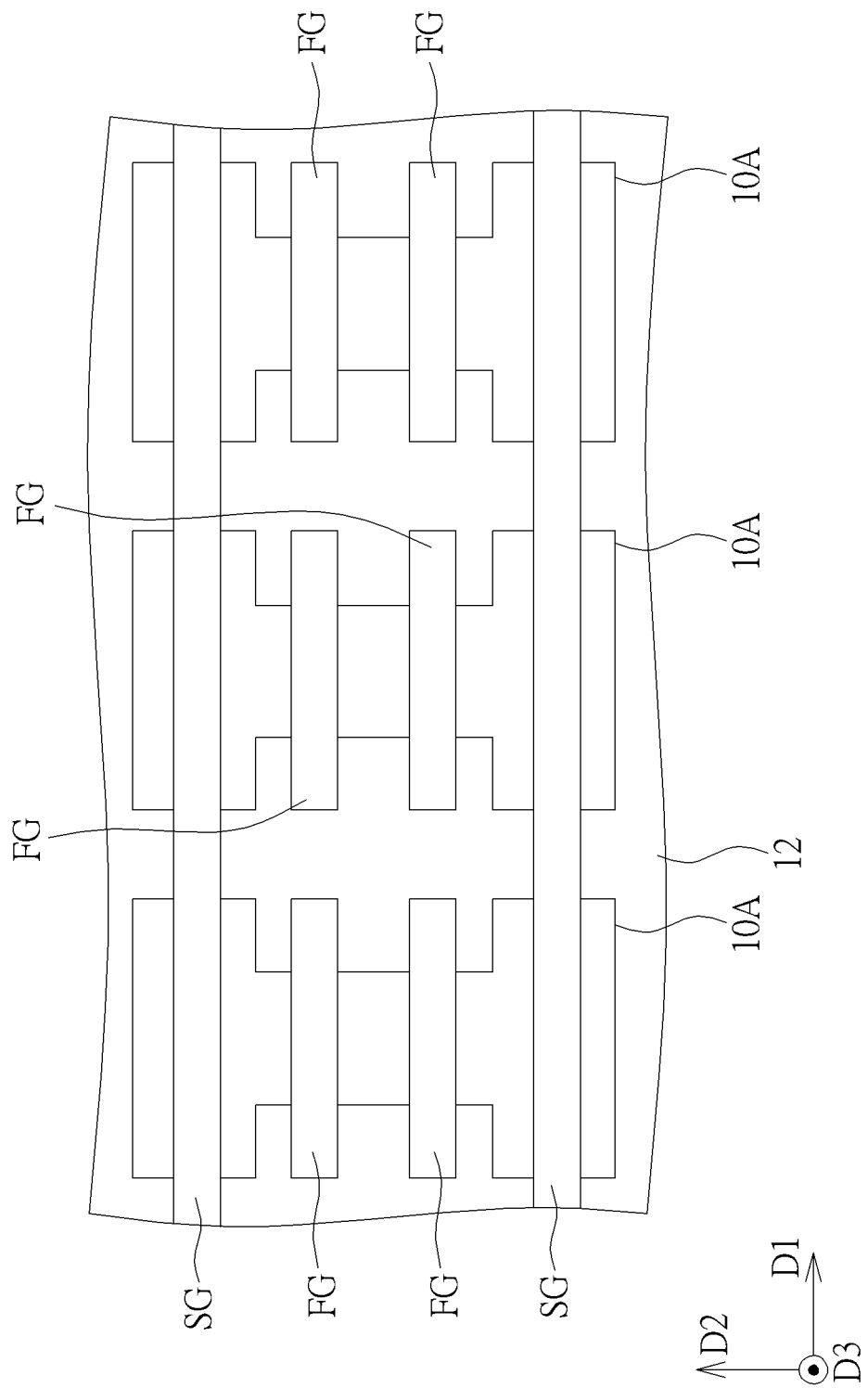
Figure 3:
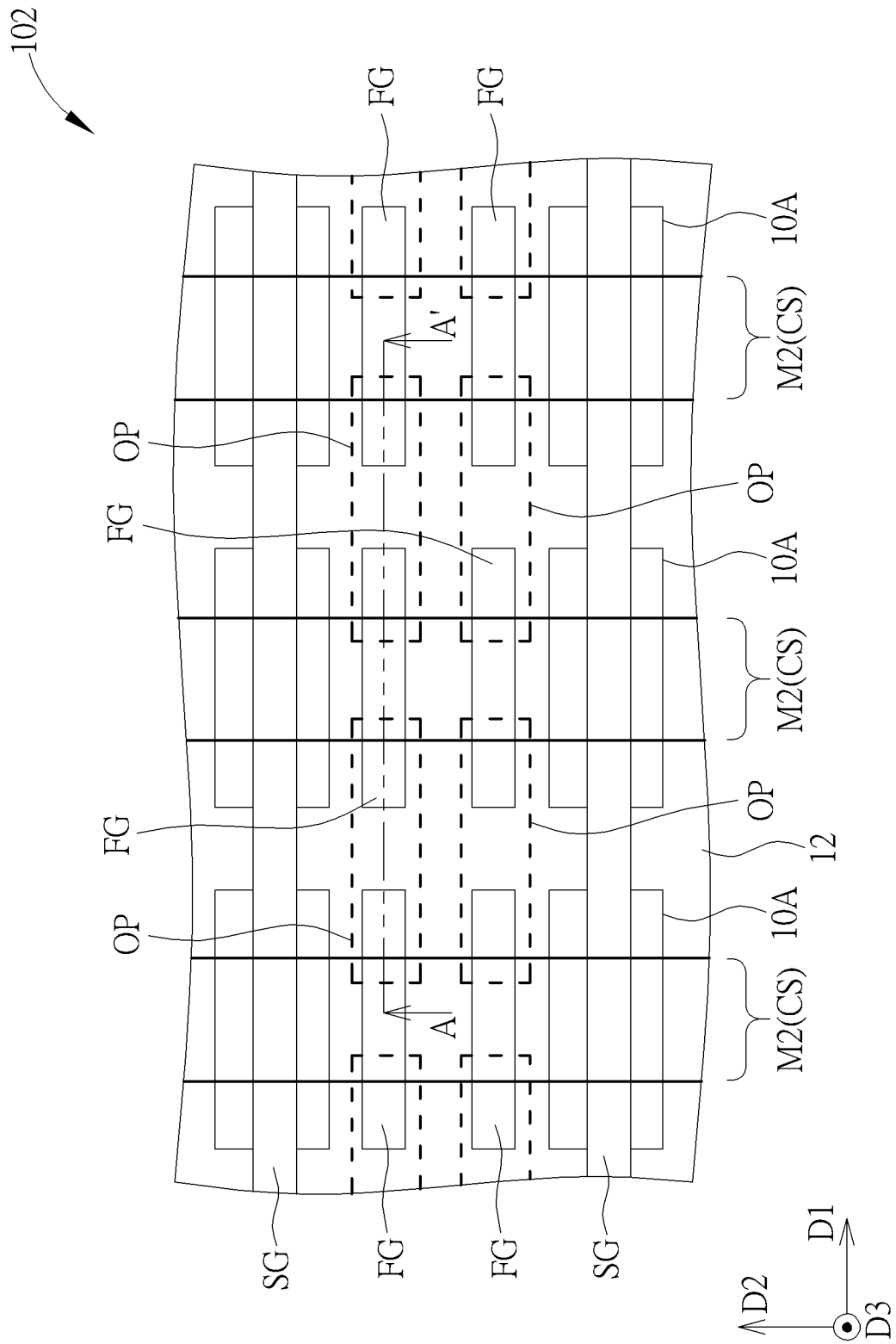
Figure 4:
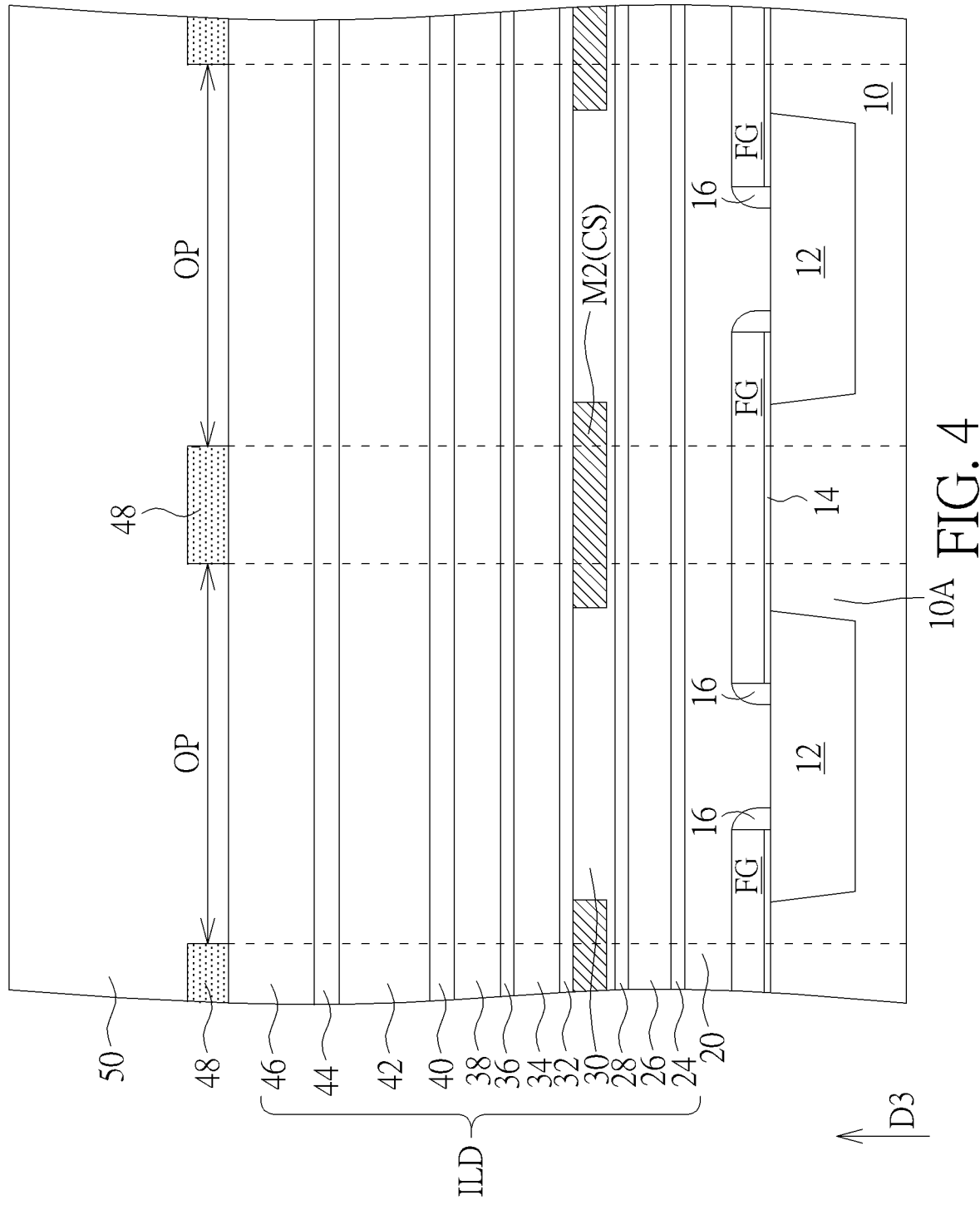
FIG. 4 is a cross-sectional diagram taken along a line A-A' in FIG. 3.

Please refer to FIGS. 2-4. FIG. 2 and FIG. 3 are schematic drawings illustrating a manufacturing method of a semiconductor memory device 102 according to a second embodiment of the present invention. FIG. 3 is a schematic drawing in a step subsequent to FIG. 2, and FIG. 4 is a cross-sectional diagram taken along a line A-A' in FIG. 3. As shown in FIGS. 2-4, the semiconductor memory device 102 may include a plurality of the floating gate electrodes FG and a plurality of the selecting gate electrodes SG Each of the floating gate electrodes FG and each of the selecting gate electrodes SG may be elongated in a first direction D1 respectively, the selecting gate electrodes SG may be located at two opposite sides of the floating gate electrodes FG in a second direction D2, and the second direction D2 may be substantially orthogonal to the first direction D1, but not limited thereto. In some embodiments, each of the floating gate electrodes FG may be disposed above a part of the isolation structure 12 and one of the active regions 10A in the third direction D3. The floating gate electrodes FG located corresponding to different active regions 10A may be separated from one another, and each of the selecting gate electrodes SG may be disposed on different active regions 10A, but not limited thereto.

Additionally, in some embodiments, each of the openings OP may overlap a part of the active region 10A disposed under the floating gate electrode FG located corresponding to this opening OP in the third direction D3. A part of the interconnection structure CS (such as a part of the conductive layer M2) may be disposed between the opening OP and the floating gate electrode FG located corresponding to this opening OP in the third direction D3, and the part of the interconnection structure CS (such as a part of the conductive layer M2) may be disposed between the opening OP and the part of the active region 10A overlapped by this opening OP in the third direction D3. By the allocation described above, the opening OP may be enlarged for increasing the overlapping area between the floating gate electrode FG and the opening OP, and the negative influence of the above-mentioned irradiation operation performed to the floating gate electrode FG on the active regions 10A may be reduced. In other words, the conductive layers in the interconnection structure CS (such as metal conductive layers) may be capable of reflecting and/or absorbing the light used in the irradiation operation preferably for protecting the active regions 10A in the irradiation operation, but not limited thereto. Additionally, in some embodiments, each of the openings OP may be elongated in the first direction D1 for partially overlapping two of the floating gate electrodes FG adjacent to each other in the third direction D3, but not limited thereto. In some embodiments, each of the openings OP may partially overlap two or more of the floating gate electrodes FG in the third direction D3 according to some considerations.

Figure 5:
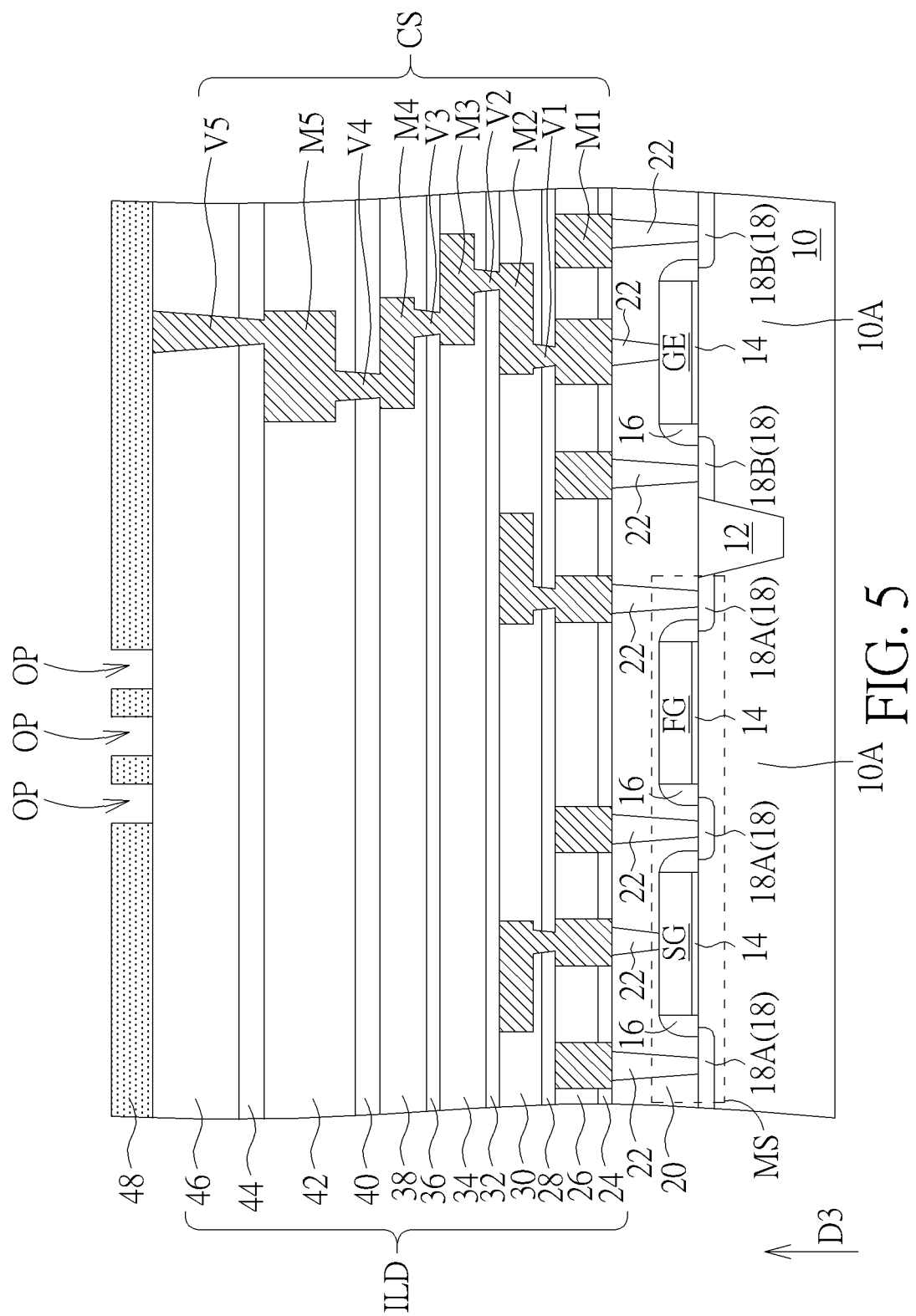
Figure 6:
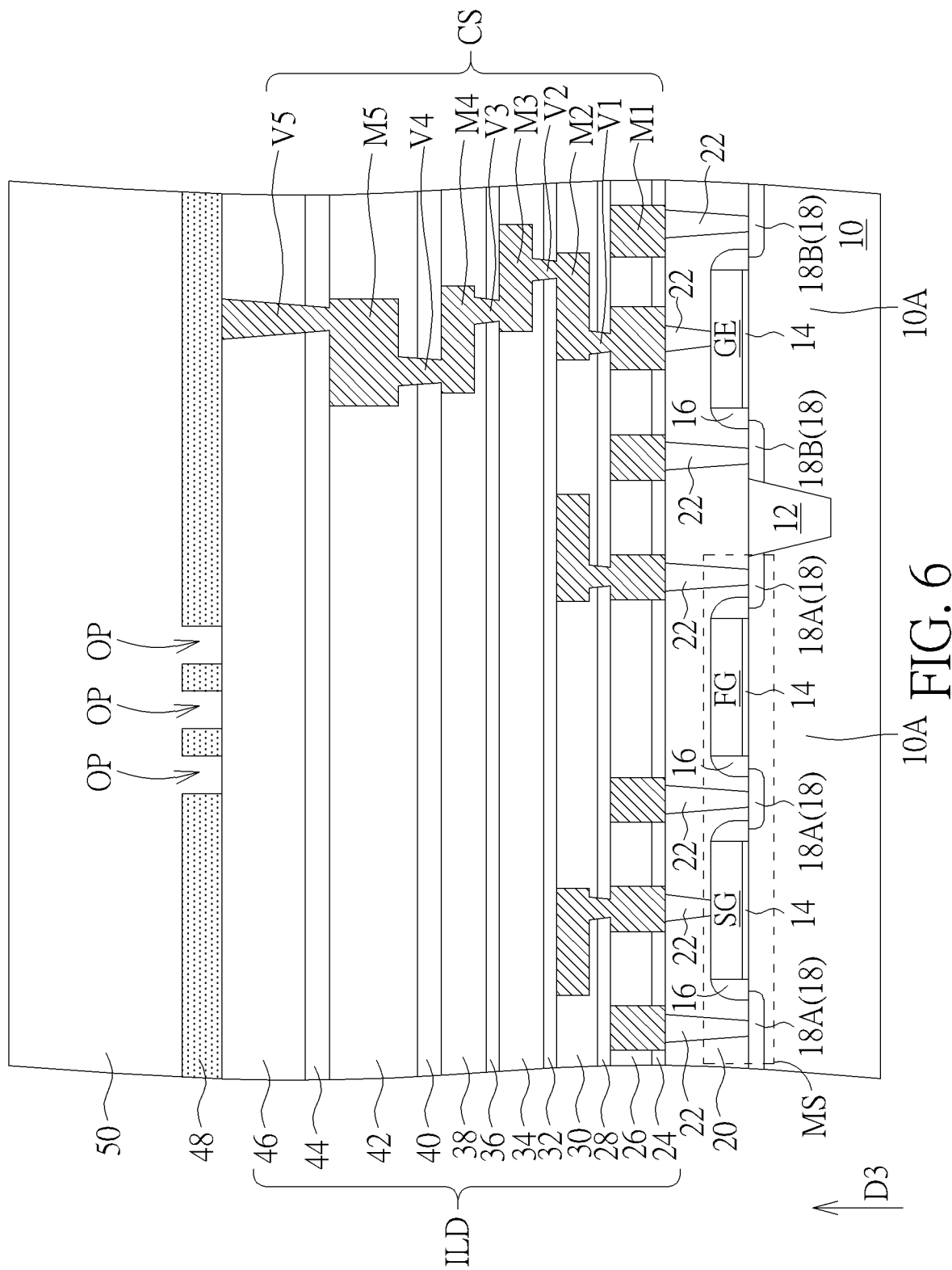
Figure 7:
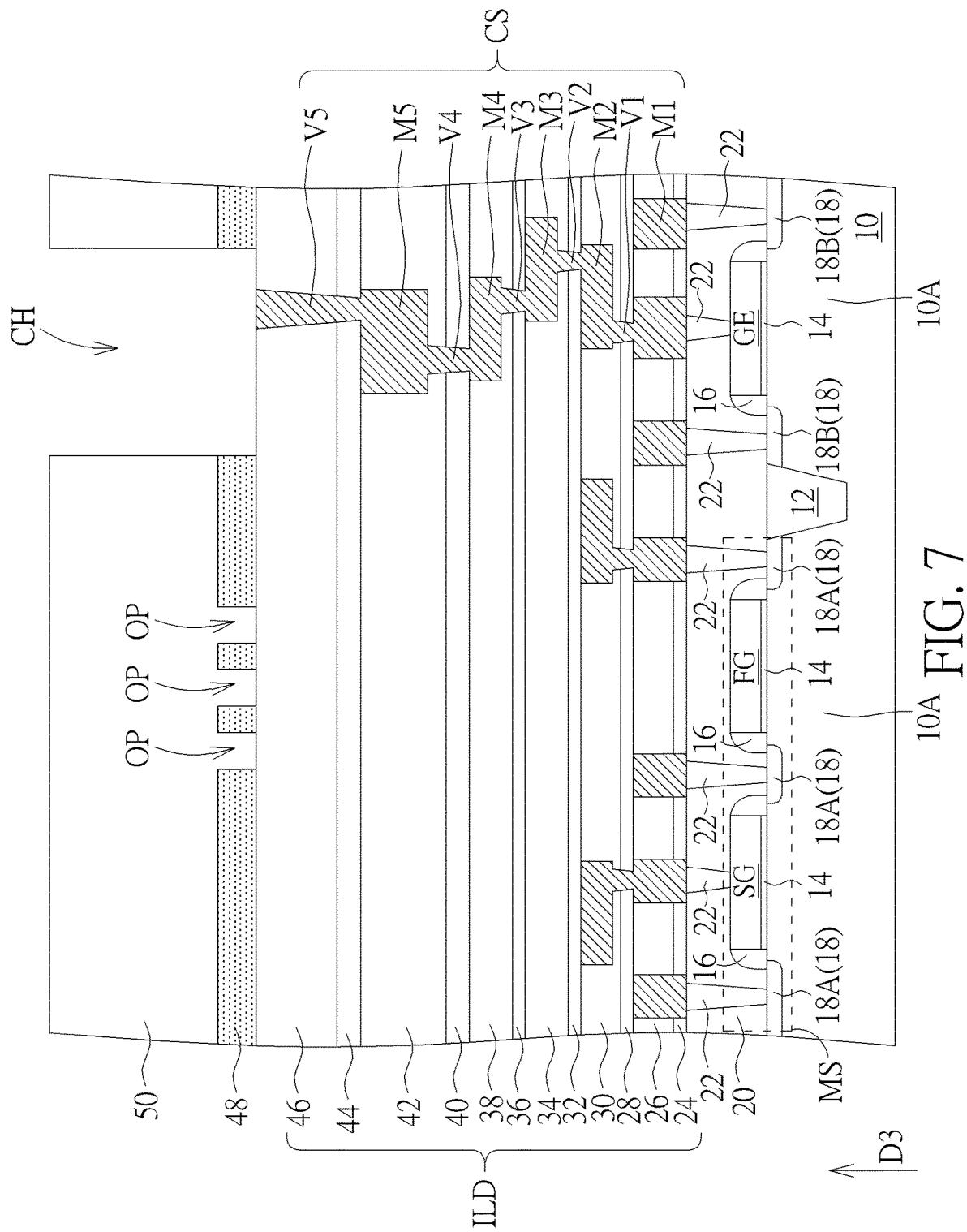

Please refer to FIGS. 5-7 and FIG. 1. FIGS. 5-7 are schematic drawings illustrating a manufacturing method of a semiconductor memory device according to a third embodiment of the present invention. FIG. 6 is a schematic drawing in a step subsequent to FIG. 5, FIG. 7 is a schematic drawing in a step subsequent to FIG. 6, and FIG. 1 may be regarded as a schematic drawing in a step subsequent to FIG. 7. A manufacturing method of the semiconductor memory device 101 described above may include but is not limited to the following steps. As shown in FIG. 5, the openings OP may be formed by a patterning process (such as a photolithography process) performed to the etching stop layer 48, and a part of the dielectric layer 46 located under the openings OP may be removed by the patterning process mentioned above, but not limited thereto. Subsequently, as shown in FIG. 5 and FIG. 6, the dielectric layer 50 may be formed after the step of forming the openings OP, the dielectric layer 50 may be formed on the etching stop layer 48, and the openings OP may be filled with the dielectric layer 50. As shown in FIG. 7, a contact opening CH may then be formed penetrating the dielectric layer 50 and the etching stop layer 48 in the third direction D3 for exposing a part of the interconnection structure CS (such as the connection plug V5). As shown in FIG. 7 and FIG. 1, the conductive structure TM may then be formed in the contact opening CH. The dielectric layer 50 needs to have a relatively thick thickness also because the conductive structure TM needs to have a relatively thick thickness, and the difficulty in controlling the etching uniformity of the step of etching the relatively thicker dielectric layer 50 may increase relatively. The damage to the interlayer dielectric layer ILD and/or the interconnection structure CS in the etching process configured to form the contact opening CH may be reduced by the etching stop layer 48 disposed between the dielectric layer 50 and the interlayer dielectric layer ILD and different etching steps for etching the dielectric layer 50 and etching the etching stop layer 48 respectively. Accordingly, the manufacturing yield may be enhanced.

To summarize the above descriptions, in the semiconductor memory device of the present invention, the opening may be disposed in the etching stop layer and disposed corresponding to the floating gate electrode for avoiding the influence of the etching stop layer on the irradiation operation performed to the floating gate electrode. Therefore, the etching stop layer may be employed in the manufacturing method of the semiconductor memory device for improving the manufacturing yield without influencing the operating conditions of the semiconductor memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor memory device, comprising:
   a substrate;
   at least one floating gate electrode disposed on the substrate;
   an interlayer dielectric layer disposed on the at least one floating gate electrode;
   an interconnection structure disposed in the interlayer dielectric layer;
   an etching stop layer disposed on the interlayer dielectric layer;
   a conductive structure penetrating the etching stop layer and electrically connected with the interconnection structure;
   an opening penetrating the etching stop layer and overlapping at least a part of the at least one floating gate electrode when viewed in a thickness direction of the substrate; and
   an isolation structure disposed in the substrate for defining active regions separated from one another in the substrate, wherein the at least one floating gate electrode is disposed above a part of the isolation structure and one of the active regions.
2. The semiconductor memory device according to claim 1, wherein
   the etching stop layer is capable of absorbing at least a part of ultraviolet (UV) radiation.

3. The semiconductor memory device according to claim 1, wherein
an ultraviolet absorptance of the etching stop layer is higher than or equal to 50%.

4. The semiconductor memory device according to claim 1, wherein
an ultraviolet absorptance of the etching stop layer is higher than an ultraviolet absorptance of the interlayer dielectric layer.

5. The semiconductor memory device according to claim 1, wherein
the conductive structure is separated from the opening.

6. The semiconductor memory device according to claim 1, further comprising:
a selecting gate electrode disposed on the substrate, wherein the opening does not overlap the selecting gate electrode when viewed in the thickness direction of the substrate.

7. The semiconductor memory device according to claim 6, wherein
the selecting gate electrode and the at least one floating gate electrode are a part of a non-volatile memory unit.

8. The semiconductor memory device according to claim 7, wherein
the non-volatile memory unit comprises a one-time programmable (OTP) non-volatile memory unit.

9. The semiconductor memory device according to claim 1, wherein
the interconnection structure comprises conductive layers and connection plugs alternately disposed in the thickness direction of the substrate, and a thickness of the conductive structure is greater than a thickness of each of the conductive layers.

10. The semiconductor memory device according to claim 1,
wherein a thickness of the conductive structure is greater than 30,000 angstroms.

11. The semiconductor memory device according to claim 1, further comprising:
a dielectric layer disposed on the etching stop layer and disposed in the opening, wherein the conductive structure further penetrates the dielectric layer.

12. The semiconductor memory device according to claim 11,
wherein the opening is fully filled with the dielectric layer.

13. The semiconductor memory device according to claim 1,
wherein a part of the interconnection structure is disposed between the opening and the at least one floating gate electrode in the thickness direction of the substrate.

14. The semiconductor memory device according to claim 1, wherein the opening overlaps a part of the active region disposed under the at least one floating gate electrode when viewed in the thickness direction of the substrate.

15. The semiconductor memory device according to claim 14,
wherein a part of the interconnection structure is disposed between the opening and the part of the active region overlapped by the opening.

16. The semiconductor memory device according to claim 1,
wherein the semiconductor memory device comprises a plurality of the floating gate electrodes, and the opening partially overlaps two of the floating gate electrodes adjacent to each other.

17. The semiconductor memory device according to claim 1,
wherein a material composition of the etching stop layer is different from a material composition of the interlayer dielectric layer.

18. The semiconductor memory device according to claim 1,
wherein the etching stop layer comprises silicon oxynitride.

19. The semiconductor memory device according to claim 1,
wherein the at least one floating gate electrode comprises polysilicon.

* * * * *